United States Patent
Liou et al.

(10) Patent No.: US 10,418,290 B2
(45) Date of Patent: Sep. 17, 2019

(54) METHOD OF PATTERNING SEMICONDUCTOR DEVICE

(71) Applicant: UNITED MICROELECTRONICS CORP., Hsin-Chu (TW)

(72) Inventors: En-Chiuan Liou, Tainan (TW); Hon-Huei Liu, Kaohsiung (TW); Chia-Hung Lin, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/423,544

(22) Filed: Feb. 2, 2017

(65) Prior Publication Data

US 2018/0218917 A1    Aug. 2, 2018

(51) Int. Cl.
*H01L 21/00*     (2006.01)
*H01L 21/66*     (2006.01)
*H01L 21/027*    (2006.01)
*H01L 29/66*     (2006.01)

(52) U.S. Cl.
CPC .......... *H01L 22/12* (2013.01); *H01L 21/0277* (2013.01); *H01L 29/66795* (2013.01)

(58) Field of Classification Search
CPC . H01L 21/31105; H01L 21/0337; H01L 22/12
See application file for complete search history.

(56) References Cited

U.S. PATENT DOCUMENTS

| | | | |
|---|---|---|---|
| 8,767,183 B2 * | 7/2014 | Den Boef | G03F 7/70633 355/55 |
| 2002/0140920 A1 * | 10/2002 | Rosenbluth | G03F 1/32 355/67 |
| 2015/0176979 A1 | 6/2015 | Mathijssen et al. | |
| 2015/0177625 A1 * | 6/2015 | De Boer | B82Y 40/00 355/67 |

\* cited by examiner

*Primary Examiner* — Richard A Booth
(74) *Attorney, Agent, or Firm* — Winston Hsu

(57) ABSTRACT

A method of patterning a semiconductor device includes following steps. First of all, a substrate is provided, and a first target pattern is formed in the substrate. Next, a second target pattern is formed on the substrate, across the first target pattern. Then, a third pattern is formed on a hard mask layer formed on the substrate, by using an electron beam apparatus, wherein two opposite edges of the third pattern are formed under an asymmetry control.

20 Claims, 3 Drawing Sheets

METHOD OF PATTERNING
// SEMICONDUCTOR DEVICE

BACKGROUND OF THE INVENTION

1. Field of the Invention

The present invention relates generally to a method of patterning a semiconductor device, and more particularly, to a method of patterning a semiconductor device by using an electron beam lithography.

2. Description of the Prior Art

In a semiconductor process, usually the pattern is formed on a resist layer in a process of lithography. Then, the resist layer serves as the etching mask to perform the dry or wet etching process so as to transfer the pattern in the resist layer to the layer to be patterned beneath the resist layer. In recent years, a micro fabrication technique has been actually used in patterning a semiconductor device, for example, using a focused beam of a charge particle line, such as an electron beam (e-beam). Generally, in the technique of the e-beam lithography, an e-beam is used to delineate the features of a semiconductor by selectively irradiating a substrate coated with an e-beam sensitivity resist. The e-beam is deflected and shaped in a precise manner to define the require shape in the resist, and the pattern is then developed in the resist.

However, with the increasing miniaturization of semiconductor devices, the design rule of line width and space between lines or devices becomes finer. Therefore, the resolution required by lithography becomes high. That is, is becomes difficult to obtain fine-sized devices in the exposure under a simplified and convenient process.

SUMMARY OF THE INVENTION

In order to solve the above-mentioned issues, the present invention provides a method of patterning a semiconductor device, in which at least one pattern in the semiconductor device is formed by using an e-beam lithography, so as to significantly control the window process tolerance of the semiconductor device.

To achieve the purpose described above, the present invention provides a method of patterning a semiconductor device including following steps. First of all, a substrate is provided, a first target pattern is formed in the substrate, and a second target pattern is formed on the substrate, across the first target pattern. Next, a hard mask layer is formed on the second target pattern and the first target pattern. Then, the hard mask layer is patterned by using an electron beam apparatus to forma third pattern in the hard mask layer, wherein two opposite edges of the third pattern are formed under an asymmetry control.

To achieve the purpose described above, the present invention provides another method of patterning a semiconductor device including following steps. A first mask pattern, a second mask pattern, and a third mask pattern are provided to a computer readable medium in a computer system. Next, a critical edge of the third mask pattern is identified. Then an edge of the third mask pattern opposite to the critical edge is identified as a non-critical edge. Following these, a CD/AA control of the critical edge is considered. After that, the first mask pattern, the second mask pattern, and the third mask pattern are outputted and displayed by using an electron beam apparatus on an electron beam sensitive resist.

Overall, in the patterning method of the present invention, different mask patterns are firstly provided in a computer system, an edge between two adjacent mask patterns is defined as a critical edge and another edge opposite to the critical edge is defined as a non-critical edge. According to the present embodiment, only the shape, the dimension or the position of the critical edge is required to be considered, for example by using a DRC tool. In this way, while outputting the mask patterns for displaying corresponding patterns on an e-beam sensitive resist, only the pattern with the critical edge is displayed under the CD/AA control. That is, the patterning process of other patterns may therefor gain more process window, and the semiconductor structure obtained therefrom may also be more reliable, accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic diagrams illustrating a method of patterning a semiconductor device according to a preferred embodiment of the present invention, wherein:

FIG. 2 shows a schematic top view of a semiconductor device after forming a pattern;

FIG. 3 shows a schematic cross-sectional view taken along a cross line A-A' in FIG. 2;

FIG. 4 shows a schematic top view of a semiconductor device after forming another pattern; and FIG. 5 shows a schematic cross-sectional view taken along a cross line A-A' in FIG. 4.

DETAILED DESCRIPTION

To provide a better understanding of the present invention, preferred embodiments will be described in detail. The preferred embodiments of the present invention are illustrated in the accompanying drawings with numbered elements.

Figure 1:
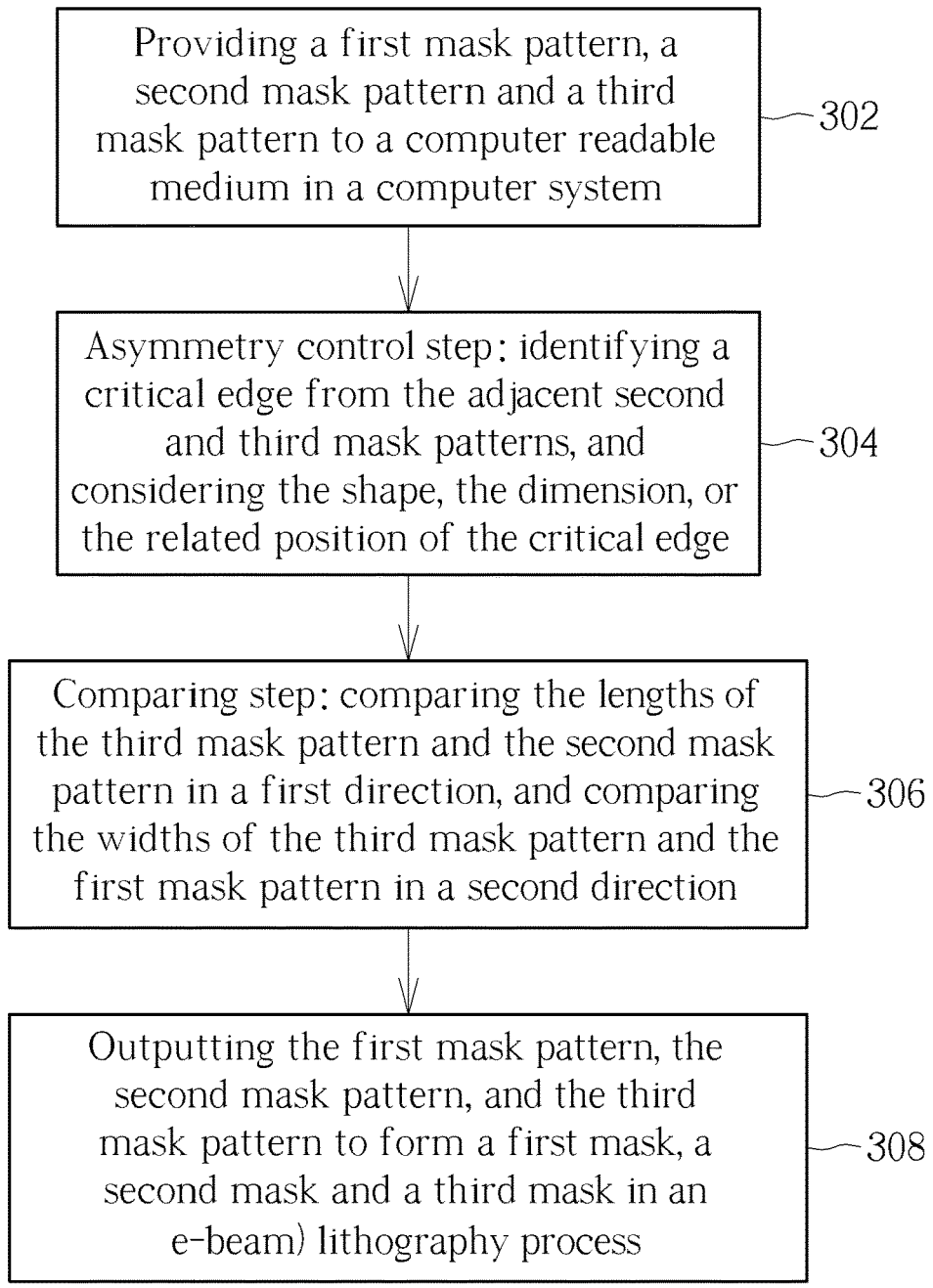
FIG. 1 is a schematic diagram illustrating a flowchart of a method of patterning a semiconductor device according to a preferred embodiment of the present invention.

The present invention is related to a patterning method used in a semiconductor process to form a semiconductor structure. In one embodiment, the semiconductor process is a contact forming process, and the semiconductor structure is an interconnection system, but is not limited thereto. Please refer to FIG. 1, which shows a schematic diagram illustrating a flowchart of the patterning method in the preferred embodiment of the present invention. As shown in FIG. 1, the patterning method includes providing a first mask pattern, a second mask pattern and a third mask pattern to a computer readable medium in a computer system (step 302), wherein the first mask pattern, the second mask pattern and the third mask pattern are related to structures from bottom to top in sequence, in a corresponding semiconductor process. In one embodiment, the first mask pattern, the second mask pattern and the third mask patter are respectively related to a first structure such as a fin structure or a nanowire structure, a second structure such as a gate, and a third structure such as a contact slot, disposed sequentially in a semiconductor structure.

Next, an asymmetry control step (step 304) is carried out by using the computer system. The asymmetry control step for example includes considering the shape, the dimension, or the related position between two adjacent mask patterns, to determine if a CD/AA control is required. Before the considering, the asymmetry control further includes identifying a critical edge from two adjacent mask patterns (step 304). For example, the second mask pattern is adjacent the third mask pattern, and an edge of the third mask pattern adjoined the second mask pattern is identified as the critical edge. On the other hand, another edge opposite to the critical edge is identified as a non-critical edge. It is noted that, only the shape, the dimension, or the position of the critical edge is required to be considered, for example by using a design rule checking (DRC) tool.

Then, a comparing step (step 306) is also carried out by using the computer system. The comparing step for example includes comparing the lengths of the third mask pattern and the second mask pattern in a first direction D1 (such as a y-direction), and comparing the widths of the third mask pattern and the first mask pattern in a second direction D2 (such as an x-direction), to check if a predetermined length of the third mask pattern is less than the length of the second mask pattern in the first direction (D1), and a predetermined width of the third mask patter is less than the width of the first mask pattern in the second direction D2. Then, according to the result of the comparing step, an optional correction step may be provided.

Last, the first mask pattern, the second mask pattern, and the third mask pattern are then outputted to form a first mask, a second mask and a third mask (step 308) respectively, and the first mask, a second mask and a third mask may therefore be used in an electron beam (e-beam) lithography process to display a first pattern which is related to the first mask, a second pattern which is related to the second mask, and a third pattern which is related to the third mask on an e-beam sensitive resist. It is noted that, while displaying the third pattern on the e-beam sensitive resist by using an e-beam apparatus, the critical edge of the third mask is displayed by irradiating a partial beam with a finest pixel, for example a pixel size thereof may be about 0.5 micrometers; and the non-critical edge of the third mask is displayed by irradiating a partial beam with a related greater pixel, for example a pixel size thereof may be more than 0.5 micrometers, but is not limited thereto. On the other hand, the critical edge of the third mask is displayed under a related smaller irradiating rate, and the non-critical edge of the third mask is displayed under a related greater irradiating rate. That is, the third pattern formed on the e-beam sensitive resist may therefore obtain a finer and precise edge at the side which is adjacent to the second pattern in the second direction D2.

Figure 2:
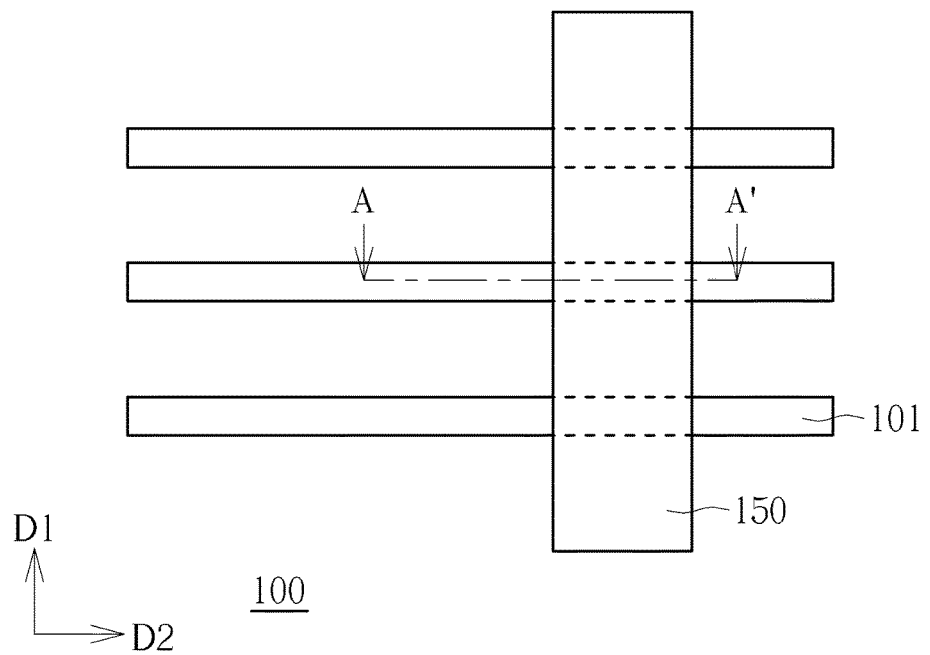
Figure 3:
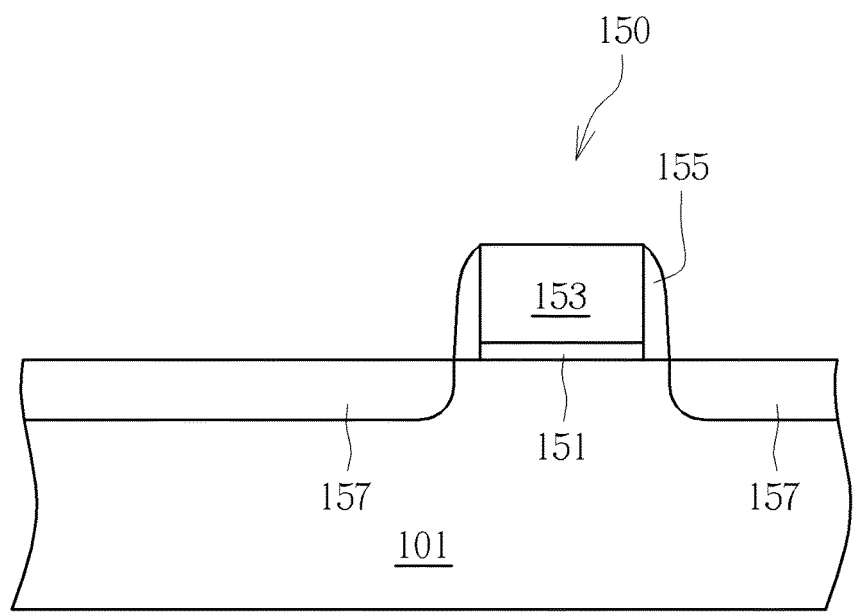

In one embodiment, the first pattern on the e-beam sensitive resist is used to pattern a substrate 100, thereto form a plurality of first target pattern such as fin structures 101 in the substrate 100, as shown in FIGS. 2-3. The fin structures 101 are parallel with each other, along the second direction D2.

Then, the second pattern on the e-beam sensitive resist is used to pattern a gate dielectric layer (not shown in the drawings) and a conductive layer (not shown in the drawings) stacked one over another on the substrate 100, thereto form a second target pattern such as a gate 150, as shown in FIGS. 2-3, wherein the gate 150 is across the fin structures 101, and for example includes a gate dielectric layer 151 and a conductive layer 153 stacked on the substrate 100. Then, a spacer 155 is formed in the subsequent process to surround the gate 150, and a source/drain region 157 is formed in also the subsequent process to dispose at two sides of the gate 150 in the substrate 100.

Figure 4:
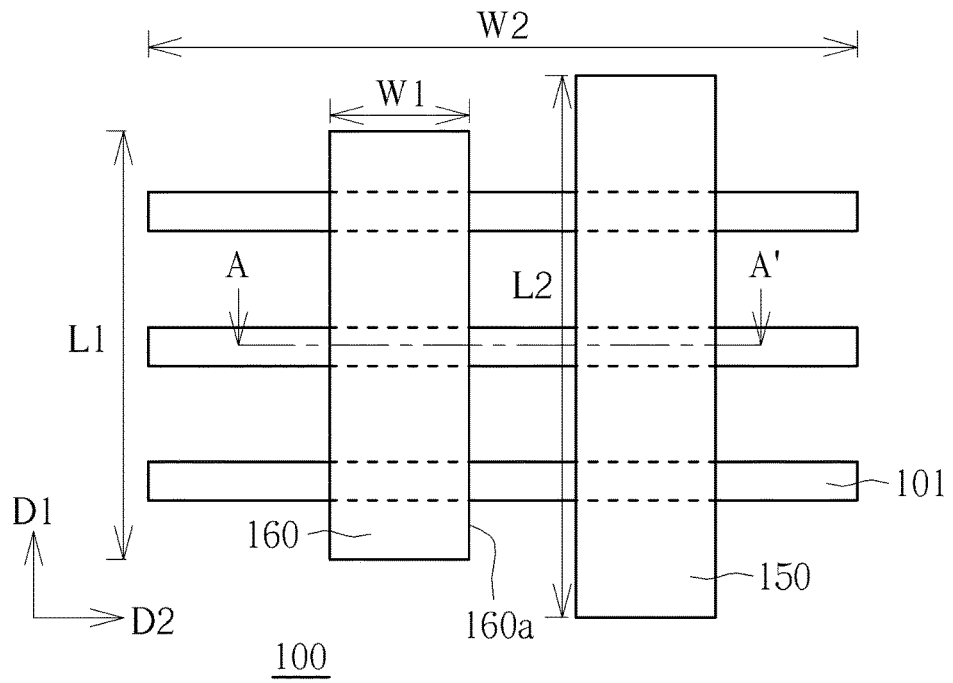
Figure 5:
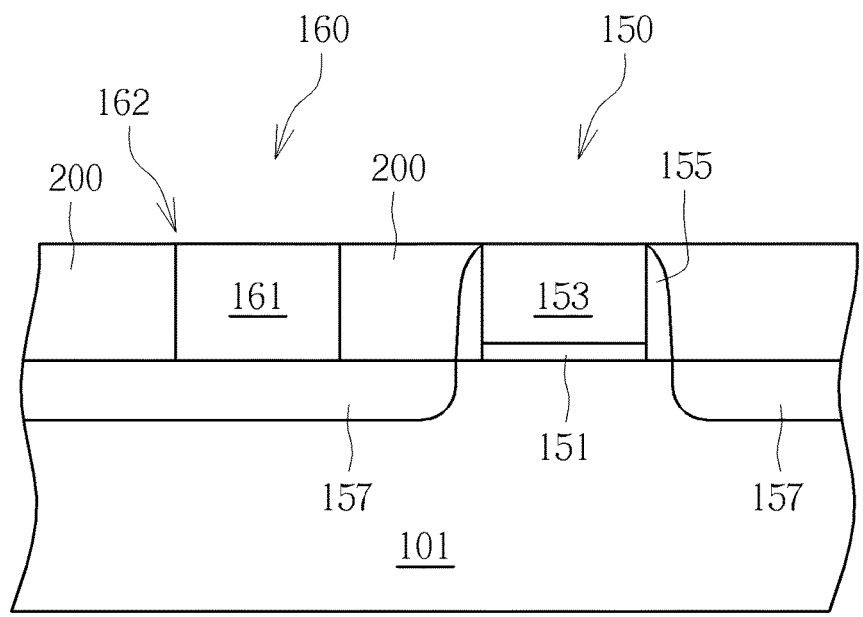

Following these, the third pattern on the e-beam sensitive resist is used to pattern an interlayer dielectric (ILD) layer 200 covered on the substrate 100 and the gate 150, thereto form a third target pattern such as at least one contact slot 160 in the ILD layer 200, as shown in FIGS. 4-5. Precisely, a multilayered hard mask layer (not shown in the drawings) is firstly provided on the ILD layer 200, for example including a metal hard mask layer (not shown in the drawings), a bottom anti-reflective coating (BARC) layer (not shown in the drawings) and the e-beam sensitive resist, and the third pattern on the e-beam sensitive resist is firstly transferred into the metal hard mask layer, and then further transferred to the ILD layer 200 to form at least one third target pattern in the ILD layer 200, such as a trench 162 as shown in FIG. 5. After that, a conductive material layer 161 including tungsten (W) or other low-resistant metals is filled in the trench 162 to form the contact slot 160.

Through the above processes, the patterning method of the present invention is completed. It is noted that, since the contact slot 160 is formed related to the third pattern which is generated from the third mask pattern, only an edge 160a thereof which is adjacent to the gate 150 may be formed with fine shape and dimension, as shown FIG. 4. That is, the process window of the entire contact slot 160 may be further flexible. Also, a length L1 of the contact slot 160 has been adjusted to be smaller than a length L2 of the gate 150 in the first direction D1, and a width W1 of the contact slot 160 has also be adjusted to be smaller than a width W2 of the fin structures 101 in the second direction D2. Thus, according to the present patterning method, a semiconductor structure in a precise layout is obtained under a simplified process.

People skilled in the art should easily understand that although the aforementioned embodiment is exemplified by forming all three patterns via the e-beam lithography, the present invention is not limited thereto. In another embodiment, the first pattern and/or the second pattern may also be formed through other process, such as a photography process, and the third pattern is still formed via the e-beam lithography to ensure the critical edge being formed under asymmetry CD/AA control Overall, in the patterning method of the present invention, different mask patterns are firstly provided in a computer system, an edge between two adjacent mask patterns is defined as a critical edge and another edge opposite to the critical edge is defined as a non-critical edge. According to the present embodiment, only the shape, the dimension or the position of the critical edge is required to be considered, for example by using a DRC tool. In this way, while outputting the mask patterns for displaying corresponding patterns on an e-beam sensitive resist, only the pattern with the critical edge is displayed under the CD/AA control. That is, the patterning process of other patterns may therefor gain more process window, and the semiconductor structure obtained therefrom may also be more reliable, accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of patterning a semiconductor device, comprising:
   providing a substrate;
   forming a first target pattern in the substrate;
   forming a second target pattern on the substrate, across the first target pattern;
   forming a hard mask layer on the second target pattern and the first target pattern;
   providing a mask pattern having symmetric two edges in a computer system, identifying one of the two edge as a critical edge and another one of the two edges as a non-critical edge respectively; and patterning the hard mask layer by using an electron beam apparatus to form a third target pattern in the hard mask layer, wherein two opposite edges of the third target pattern are formed through the one edge and the another edge of the mask pattern under an asymmetry control.

2. The method of patterning the semiconductor device according to claim 1, wherein the hard mask layer comprises an e-beam sensitive resist.

3. The method of patterning a semiconductor device according to claim 1, wherein the critical edge is formed under a critical dimension/active area control (CD/AA) control.

4. The method of patterning a semiconductor device according to claim 1, wherein the non-critical edge is formed without a critical dimension/active area control (CD/AA) control.

5. The method of patterning a semiconductor device according to claim 1, wherein the forming of the third target pattern comprises:
  irradiating a first partial beam with a first pixel to display the critical edge; and
  irradiating a second partial beam with a second pixel to display the non-critical edge, and an irradiating rate of the first partial beam is less than an irradiating rate of the second partial beam.

6. The method of patterning a semiconductor device according to claim 1, wherein the forming of the third target pattern comprises:
  irradiating a first partial beam with a first pixel to form the critical edge; and
  irradiating a second partial beam with a second pixel to form the non-critical edge, and the second pixel is greater than the first pixel.

7. The method of patterning a semiconductor device according to claim 1, wherein the forming of the third target pattern further comprises:
  comparing a length of the mask pattern to a length of another mask pattern.

8. The method of patterning a semiconductor device according to claim 7, wherein the forming of the third target pattern further comprises:
  comparing a width of the mask pattern to a width of the other mask pattern.

9. The method of patterning a semiconductor device according to claim 1, further comprising:
  forming a dielectric layer covered the second target pattern and the first target pattern; and
  forming at least one trench in the dielectric layer by transferring the third target pattern into the dielectric layer.

10. The method of patterning a semiconductor device according to claim 1, wherein the first target pattern comprises a fin structure or a nanowire structure, and the second target pattern comprises a gate.

11. A method of patterning a semiconductor device, comprising:
  providing a first mask pattern, a second mask pattern, and a third mask pattern to a computer readable medium in a computer system, wherein the third mask pattern having symmetric two edges;
  identifying one of the symmetric two edges as a critical edge;
  identifying another one of the symmetric two edges as a non-critical edge;
  considering a critical dimension/active area control (CD/AA) control to the critical edge; and
  outputting and displaying the first mask pattern, the second mask pattern, and the third mask pattern by using an electron beam apparatus on an electron beam sensitive resist, wherein two opposite edges of a pattern is formed through the one edge and the another edge of the third mask pattern.

12. The method of patterning a semiconductor device according to claim 11, wherein the critical edge of the third mask pattern is adjacent to the second pattern.

13. The method of patterning a semiconductor device according to claim 11, wherein the displaying of the third mask pattern comprises:
  irradiating a first partial beam with a first pixel to form the critical edge; and
  irradiating a second partial beam with a second pixel to form the non-critical edge, and an irradiating rate of the first partial beam is less than an irradiating rate of the second partial beam.

14. The method of patterning a semiconductor device according to claim 13, wherein the second pixel is greater than the first pixel.

15. The method of patterning a semiconductor device according to claim 11, further comprises:
  comparing a length of the third mask pattern to a length of the second mask pattern; and
  comparing a width of the third mask pattern to a width of the first mask pattern.

16. The method of forming a semiconductor device according to claim 11, wherein the first mask pattern is related to a fin structure or a nanowire structure.

17. The method of forming a semiconductor device according to claim 11, wherein the second mask pattern is related to a gate, and the third mask pattern is related to a contact plug.

18. The method of forming a semiconductor device according to claim 11, wherein the second mask pattern is disposed adjacent to the third mask pattern, an edge of the third mask pattern disposed closer to the second mask pattern is identified as the critical edge of the third mask pattern, while an another edge disposed further from the second mask pattern is defined as a non-critical edge of the third mask pattern, and the critical edge and the non-critical edge are identified under a schematic top view.

19. A method of patterning a semiconductor device, comprising:
  providing a substrate;
  forming a first target pattern in the substrate;
  forming a second target pattern on the substrate, across the first target pattern;
  forming a hard mask layer on the second target pattern and the first target pattern;
  providing a mask pattern and an another mask pattern in a computer system;
  identifying a critical edge of the mask pattern by locating an edge of the mask pattern disposed adjacent to the another mask pattern under a schematic top view;
  identifying an edge of the mask pattern opposite to the critical edge of the mask pattern as being a non-critical edge under the schematic top view, wherein the critical edge is formed under a critical dimension/active area (CD/AA) control while the non-critical edge is formed without the CD/AA control; and
  patterning the hard mask layer by using an electron beam apparatus to form a third target pattern in the hard mask layer, wherein two opposite edges of the third target pattern are formed under an asymmetry control.

20. The method of patterning a semiconductor device according to claim 19, wherein the second target pattern is perpendicularly overlaying directly above the first target pattern.

\* \* \* \* \*